(12) United States Patent
Cho et al.

(10) Patent No.: US 10,144,868 B2
(45) Date of Patent: Dec. 4, 2018

(54) WATER-INSOLUBLE METAL HYDRATE CONTAINING AN ALKALI METAL AND PREPARATION METHODS THEREOF

(71) Applicant: KOREA INSTITUTE OF SCIENCE AND TECHNOLOGY, Seoul (KR)

(72) Inventors: So Hye Cho, Seoul (KR); Seung Yong Lee, Seoul (KR); Khan Sovann, Seoul (KR); Jong Ku Park, Seoul (KR); Sun Jin Kim, Seoul (KR); Ho Seong Jang, Seoul (KR)

(73) Assignee: KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 158 days.

(21) Appl. No.: 14/551,602

(22) Filed: Nov. 24, 2014

(65) Prior Publication Data
US 2016/0090527 A1    Mar. 31, 2016

(30) Foreign Application Priority Data
Sep. 26, 2014   (KR) .................. 10-2014-0129424

(51) Int. Cl.
*C09K 11/77*  (2006.01)
*C09K 11/08*  (2006.01)
(Continued)

(52) U.S. Cl.
CPC ............ *C09K 11/08* (2013.01); *C01F 17/00* (2013.01); *C09K 11/55* (2013.01); *C09K 11/60* (2013.01);
(Continued)

(58) Field of Classification Search
CPC ......... C09K 11/08; C09K 11/55; C09K 11/60; C09K 11/77; C09K 11/7728;
(Continued)

(56) References Cited

U.S. PATENT DOCUMENTS

| 4,330,603 A | * | 5/1982 | Jackovitz ............... H01M 4/32 |
| | | | 252/182.1 |
| 5,879,647 A | | 3/1999 | Wataya et al. |

(Continued)

FOREIGN PATENT DOCUMENTS

| CN | 101182415 A | 5/2008 |
| CN | 102911667 A | 2/2013 |

(Continued)

OTHER PUBLICATIONS

Sun et al., "Facile Synthesis of Amine-Functionalized Eu3+ Doped La(OH)3 Nanophosphors for Bioimaging", Sep. 2, 2010, Nanoscale Research Letters, 6:24, pp. 1-7.*

(Continued)

*Primary Examiner* — Matthew E. Hoban
*Assistant Examiner* — Lynne Edmondson
(74) *Attorney, Agent, or Firm* — Ladas & Parry LLP

(57) ABSTRACT

The present invention relates to a novel method for preparing a water-insoluble metal hydroxide, and a use thereof. The water-insoluble metal hydroxide of the present invention is conveniently and efficiently prepared s through the high-temperature heat treatment step two times and the washing step, and thus contains a small amount of an alkali metal and has a high crystallinity and a phase purity. The water-insoluble metal hydroxide of the present invention or metal oxide therefrom exhibits an absorption wavelength at a low wavelength range (for example, 490 nm or less) and a light emitting wavelength at a high wavelength range (for example, from 500 nm or more to less than 1,100 nm). Accordingly, the water-insoluble metal hydroxide of the present invention may be efficiently used in various applications such as a fire retardant, an antacid, an adsorbent and so forth, and may also be doped with another metal ion to be utilized as a raw material for fabricating a catalyst, a (Continued)

fluorescent material, an electrode material, a secondary battery material and the like.

16 Claims, 17 Drawing Sheets

(51) Int. Cl.
    *H01L 33/50*     (2010.01)
    *C09K 11/55*     (2006.01)
    *C09K 11/60*     (2006.01)
    *C01F 17/00*     (2006.01)
    *H01L 31/055*     (2014.01)

(52) U.S. Cl.
    CPC .......... *C09K 11/77* (2013.01); *C09K 11/7728* (2013.01); *C09K 11/7766* (2013.01); *C09K 11/7783* (2013.01); *H01L 31/055* (2013.01); *C01P 2002/72* (2013.01); *C01P 2004/03* (2013.01); *C01P 2006/60* (2013.01); *H01L 33/502* (2013.01); *Y02E 10/52* (2013.01)

(58) Field of Classification Search
    CPC ............ C09K 11/7766; C09K 11/7783; H01L 31/02322; H01L 31/502
    USPC ......... 252/301.4 R; 427/427.4; 502/300, 305
    See application file for complete search history.

(56) References Cited

U.S. PATENT DOCUMENTS

| | | | |
|---|---|---|---|
| 6,380,117 B2 * | 4/2002 | Sato | C04B 35/468 501/139 |
| 6,712,993 B2 | 3/2004 | Kijima et al. | |
| 2004/0062699 A1 * | 4/2004 | Oshio | C04B 35/01 423/263 |
| 2006/0158090 A1 * | 7/2006 | Wang | H01J 1/63 313/485 |
| 2006/0170332 A1 * | 8/2006 | Tamaki | C09K 11/02 313/498 |
| 2008/0305025 A1 * | 12/2008 | Vitner | B01J 23/16 423/263 |
| 2011/0126889 A1 * | 6/2011 | Bourke, Jr. | H01L 31/055 136/253 |
| 2011/0143139 A1 | 6/2011 | Maddan | |
| 2012/0041246 A1 * | 2/2012 | Scher | B01J 21/066 585/500 |

FOREIGN PATENT DOCUMENTS

| JP | 2006-283006 A | 10/2006 |
|---|---|---|
| KR | 100779237 B1 | 11/2007 |
| KR | 101045236 B1 | 6/2011 |

OTHER PUBLICATIONS

Fumiyuki Shiba, et al; "Hydrothermal synthesis of one-dimensional yttrium hydroxide particles by a two-step alkali-addition", CrystEngComm; vol. 15, pp. 1061-1067; First published online Oct. 24, 2012.

The First Chinese Office Action dated Jul. 3, 2017; Appln. No. 201410721199.7.

The Second Chinese Office Action dated Mar. 8, 2018; Appln. No. 201410721199.7.

* cited by examiner

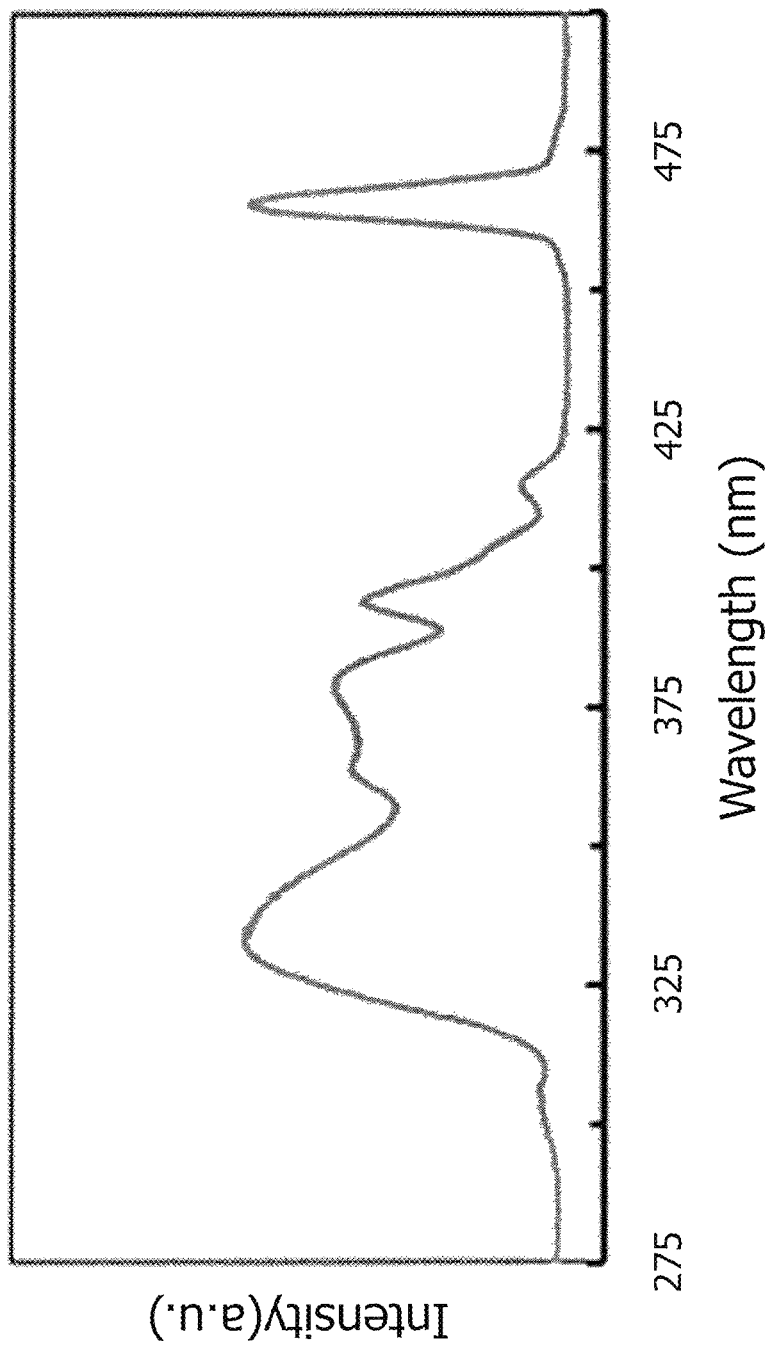

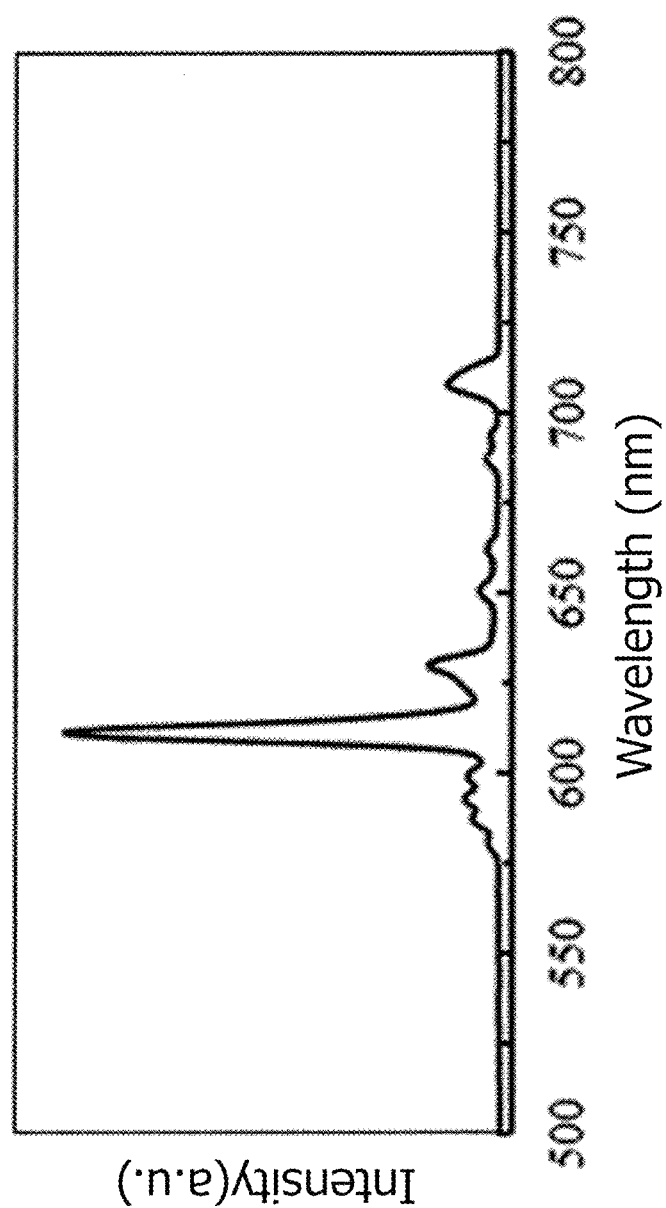

WATER-INSOLUBLE METAL HYDRATE CONTAINING AN ALKALI METAL AND PREPARATION METHODS THEREOF

CROSS-REFERENCE TO RELATED APPLICATION

Pursuant to 35 U.S.C. § 119(a), this application claims the benefit of earlier filing date and right of priority to Korean Application No. 10-2014-0129424, filed on Sep. 26, 2014, the contents of which is incorporated by reference herein in its entirety.

BACKGROUND OF THE DISCLOSURE

1. Field of the Disclosure

The present disclosure relates to a metal hydrate having an excellent crystalline property, and a preparation method thereof, wherein the metal hydrate includes an alkali metal.

2. Background of the Disclosure

A metal hydrate is a compound formed of a metal ion and a hydroxy group ($OH^-$), and a hydrate having a strong ion bond property such as sodium hydroxide is feasibly dissolved in an aqueous solution, whereas a hydrate having a strong covalent bond property such as beryllium hydroxide ($Be(OH)_2$) is not easily dissolved in an aqueous solution. Except for beryllium hydroxide and magnesium hydroxide, most metal hydrates of the alkali group and the alkaline earth group are well dissolved in water, whereas hydrates of transition metals, post-transition metals and lanthanum metals including Mn, Fe, Co, Ni, Cu, Zn, Y, Zr, Ru, Rh, Ag, Cd, Ir, W, Au, Hg, Al, Ga, In, Sn, Tl, Pb, Bi, Ce, Pr, Nd, Pm, Sm, Eu, Gd, Tb, Dy, Ho, Er, Tm, Yb or Lu are water-insoluble. The water-soluble metal hydrates are used as strong bases, and the water-insoluble metal hydrates are utilized as fire retardants, antacids, adsorbents and the like. Besides, the water-insoluble hydrates are used as a catalyst, an fluorescent substance, an electrode material, a secondary battery material, a fiber material, a magnetic material, and so forth.

In addition, the aforementioned water-insoluble metal hydrates may be converted into metal oxides by heat treatment at a high temperature of 500° C. or more, and thus are also utilized as a precursor for preparing oxides. For example, yttrium hydrate ($Y(OH)_3$) generally forms a structural body such as a rod, a wire, a tube and a layered structure due to the hexagonal phase, and the yttrium hydrate with this structure may be dehydrated by heat treatment at a high temperature (for example, 500° C. or more) to be converted into yttrium oxide ($Y_2O_3$). At this time, it is possible to form an yttrium oxide ($Y_2O_3$) having a structure such as a rod, a wire and a tube according to the characteristics in is which the structure is maintained (See: Shiba, F., et at., CrystEngComm, 2013, 15: 1061-1067).

Meanwhile, US Patent Application Publication No. 2011/0143139 is related to a method for preparing a metal hydroxide nanoplatelet, wherein the metal hydroxide nanoplatelet is composed of oxides or hydroxides of various metals by an electrochemical method (using an electrolyzer). The electrochemical method is disadvantageous in that the method requires complicated steps and is not economically efficient as compared to a combustion synthesis method.

U.S. Pat. No. 5,879,647 discloses a method for precipitating particles of yttrium oxide in a solution containing an yttrium salt (a method using urea). However, since complicated processes are required for controlling the particle size of yttrium oxide, and the production rate thereof is low, the method is not suitable for a large-scale production.

Further, the water-insoluble metal hydrate may be produced by a liquid-phase method such as a hydrothermal synthesis or a precipitation method from a nitrate, a chloride, a carbonate and the like of metal. However, metal hydrates produced by the above-described liquid-phase method generally tend to have low crystallinity and be unstable. In addition, it is difficult to dope the water-insoluble metal hydrate prepared by the liquid-phase method with an alkali metal component due to the characteristics of the process. These limitations in the process make it difficult to uniformly contain an alkali metal component in a metal hydrate or an oxide derived therefrom, restricting an utility of a metal oxide.

Therefore, there has been an urgent need in the art for a preparation method of solving the above-described drawbacks.

Throughout this application, various patents and publications are referenced and citations are provided in parentheses. The disclosure of these patents and publications in their entities are hereby incorporated by references into this application in order to more fully describe this invention and the state of the art to which this invention pertains.

SUMMARY OF THE DISCLOSURE

The present inventors have done intensive studies to develop a novel method for preparing a water-insoluble metal hydroxide having high crystallinity. As a result, the present inventors have discovered a method for preparing a water-insoluble metal hydroxide in a convenient and efficient manner by adding a water-soluble alkali salt to a reaction mixture, combusting the resulting mixture with a combustion synthesis method instead of a liquid-phase method, performing a secondary heat treatment at a high temperature (for example, 700° C. to 1,400° C.), and washing the resulting product to remove alkali components which are highly reactive with water, and have confirmed that a part of alkali metal components is remaining in the prepared water-insoluble metal hydroxide, which had formed a chemically stable bond prior to the heat treatment, thereby completing the present disclosure.

Therefore, an aspect of the detailed description is to provide a method for preparing a water-insoluble metal hydroxide.

Another aspect of the detailed description is to provide a water-insoluble metal hydroxide prepared by the above-described method.

Still another aspect of the detailed description is to provide a method for preparing a water-insoluble metal oxide.

Yet another aspect of the detailed description is to provide a light emitting device.

Still yet another aspect of the detailed description is to provide a wavelength conversion composition for a solar cell.

Other objects and advantages of the present disclosure will become apparent from the following detailed description together with the appended claims and drawings.

In one aspect of this invention, there is provided a method for preparing a water-insoluble metal hydroxide, comprising the steps of:

(a) combusting a mixed aqueous solution of a metal salt, an alkali salt and an urea at a temperature of from 400° C. or more to less than 700° C.;

(b) subjecting a powder obtained in step (a) to heat treatment at a temperature of 700° C. to 1,300° C.; and (c) washing a powder obtained in step (b) with an aqueous solution.

In another aspect of this invention, there is provided a water-insoluble metal hydroxide represented by the following Formula 1, which is prepared according to the aforementioned method:

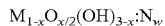  Formula 1 in the Formula 1, M is one or more metals selected from the group consisting of a lanthanide metal, a transition metal and a post-transition metal; N is an alkali or alkaline earth metal; and x is a real number of $0 \leq x \leq 2.9$ and w is a real number of $0.00001 \leq w \leq 0.5$.

In still another aspect of this invention, there is provided a method for preparing a water-insoluble metal oxide, comprising the step of: heating the water-insoluble metal hydroxide prepared according to the above-described method in a temperature range of 300° C. to 1,400° C.

In further still another aspect of this invention, there is provided a light emitting device comprising the aforementioned fluorescent water-insoluble metal hydroxide or a metal oxide therefrom, and a excitation light source of 490 nm or less.

The present inventors have done intensive studies to develop a novel method for preparing a water-insoluble metal hydroxide having high crystallinity. As a result, the present inventors have discovered a method for preparing a water-insoluble metal hydroxide in a convenient and efficient manner by adding a water-soluble alkali salt to a reaction mixture, combusting the resulting mixture with a combustion synthesis method instead of a liquid-phase method, performing a secondary heat treatment at a high temperature (for example, 700° C. to 1,400° C.), and washing the resulting product to remove alkali components which are highly reactive with water, and have confirmed that a part of alkali metal components is remaining in the prepared water-insoluble metal hydroxide, which had formed a chemically stable bond prior to the heat treatment.

The metal-doped yttrium oxide is useful as a basic material in various fields, for example including a light emitting fluorescent material, a sintering aid of various kinds of ceramic materials, and a gain medium in a high-power solid-state laser system, and this is because the material has improved sintering capabilities (for example, high thermal conductivity) and unique light emitting properties (for is example, broad emission line-width). Accordingly, various methods for obtaining the yttrium oxide (or yttrium oxide nanopowder) having an excellent sintering capability and a fine and uniform particle size (for example, a mechanical crushing method, a gas evaporation method, a co-precipitation method, a sol-gel synthesis method, etc.) have been attempted. However, the methods has a limitation that it is difficult to industrially apply the methods since the process steps are complicated, or it is very difficult to control the size of the yttrium oxide nanopowder when the processes are simple.

The present invention provides a novel method for preparing a water-insoluble metal hydroxide capable of overcoming a disadvantage in that a water-insoluble metal hydroxide is prepared, which tends to have low crystallinity and be unstable when the hydroxide is prepared by a conventional method. In addition, the method of the present invention may be feasibly applied to the preparation of various metal hydroxides, and is suitable for the preparation of a water-insoluble metal hydroxide having a fine and uniform particle size.

First, a mixed aqueous solution containing a metal salt of interest, an alkali salt and an urea is prepared. At this time, it is possible to include two or more metal salts according to the purpose. Afterward, water is evaporated from the mixed aqueous solution at a high temperature (for example, in an electric furnace pre-heated to 500° C.). The high-temperature heat treatment could be performed even at 700° C. (result not shown). After water is removed from the mixed aqueous solution by the high-temperature heat treatment, the urea in the remaining components is combusted in a short time (for example, several seconds to several minutes), and a combustion product (powder; for example, white powder) may be obtained.

In a certain embodiment, the metal salt is one or more metal salts selected from the group consisting of a lanthanide metal, a transition metal and a post-transition metal.

In a certain embodiment, the lanthanide metal is selected from the group consisting of La, Ce, Pr, Nd, Pm, Sm, Eu, Gd, Tb, Dy, Ho, Er, Tm, Yb and Lu; the transition metal is selected from the group consisting of Mn, Fe, Co, Ni, Cu, Zn, Y, Zr, Ru, Rh, Ag, Cd, Ir, W, Au and Hg; and the post-transition metal is selected from the group consisting of Al, Ga, In, Sn, Tl, Pb and Bi.

In a certain embodiment, the metal salt is one or more metals selected from the group consisting of Y, Pr, Eu, Gd, Tb, Er, Tm and Yb.

In a certain embodiment, the alkali salt is selected from alkali metal and alkaline earth metal salts, and more practically, is a salt compound including Li, Na, K, Rb, Cs, Fr, Be, Mg, Ca, Sr, Ba or Ra.

In a certain embodiment, the water-insoluble metal hydroxide includes the alkali salt with an amount of at least one equivalent or larger than an amount of the metal salt (see: Table 1).

In a certain embodiment, the high-temperature heat treatment is performed at a temperature of from 400° C. or more to less than 700° C.

Subsequently, the combustion product (powder) is subjected to a secondary high-temperature heat treatment. Oxidation is more completely accomplished by the high-temperature heat treatment, and the time for the high-temperature heat treatment is determined depending on the amount of the alkali salt which had been previously added. The secondary high-temperature heat treatment step may be performed under the atmosphere, oxygen 99%, hydrogen 99%, or nitrogen 99%.

In a certain embodiment, the high-temperature heat treatment is performed at a temperature range of from 700° C. or less than 1,300° C., and more practically, of from 800° C. or more to less than 1,200° C.

In a certain embodiment, the high-temperature heat treatment is performed for 1 to 4 hrs, more practically 2 hrs, but is not limited to. That is, the time for the high-temperature heat treatment may vary depending on the amount of the alkali salt added in the step (the step of preparing a mixed aqueous solution).

In a certain embodiment, the amount of the alkali salt remaining in the metal hydroxide is in a range of 0.0001 to 70 atm %, more practically 0.0001 to 60 atm %, and much more practically 0.001 to 50 atm % as compared with that of the metal salt.

In addition, the present inventors have confirmed that by means of the method depending on the amount of the alkali salt as well as the conditions of the high-temperature heat treatment (temperature and time), a final metal hydroxide composed of only a hydroxide may be obtained (See: Examples 1 to 28), and a metal hydroxide including a metal oxide may also be yielded.

The resulting product, which has been subjected to the secondary high-temperature heat treatment, is cooled down to a room temperature, and then is washed with a suitable amount (for example, 5 to 10 ml) of an aqueous solution repeatedly, more practically 1 to 10 times, much more practically 2 to 7 times, and still much more practically 3 to 5 times. The washing process removes the alkali metal components present in excess between the metal oxide layers prepared by the previous steps through a hydration reaction, followed by forming the water-insoluble metal hydroxide.

Accordingly, the present method may effectively prepare a water-insoluble metal hydroxide containing a small amount of an alkali metal, and having a high crystallinity and a phase purity in a very short time.

A water-insoluble metal hydroxide prepared by the above-described method is represented by the following Formula 1:

$$M_{1-x}O_{x/2}(OH)_{3-x}:N_w \qquad \text{Formula 1}$$

in the Formula 1, M is one or more metals selected from the group consisting of a lanthanide metal, a transition metal and a post-transition metal; N is an alkali or alkaline earth metal; and x is a real number of $0 \leq x \leq 2.9$ and w is a real number of $0.00001 \leq w \leq 0.5$.

In a certain embodiment, M is one or more metals selected from the group consisting of Y, Pr, Eu, Gd, Tb, Er, Tm and Yb, and N is selected from the group consisting of Li, Na, K, Rb, Cs and Fr.

In the preparation method according to the present invention, the water-insoluble metal hydroxide represented by the Formula 1 indicates a compound which is not completely hydrated, and when hydration is completely achieved in the present invention (that is in the case of x=0), a water-insoluble metal hydroxide represented by the following Formula 4 is provided:

$$M(OH)_3:N_w \qquad \text{Formula 4}$$

in the Formula 4, M is one or more metals selected from the group consisting of a lanthanide metal, a transition metal and a post-transition metal; N is an alkali or alkaline earth metal; and w is a real number of $0.00001 \leq w \leq 0.5$.

In a certain embodiment, M is one or more metals selected from the group is consisting of Y, Pr, Eu, Gd, Tb, Er, Tm and Yb.

In the water-insoluble metal hydroxide represented by Formula 1, when M includes two or more metals, the present invention provides a water-insoluble metal hydroxide represented by the following Formula 2 (for example, two metals), or Formula 3 (for example, three metals).

$$(M_{1-y}M'_y)O_{x/2}(OH)_{3-x}:N_w \qquad \text{Formula 2}$$

in the Formula 2, M and M' are each one or more metals selected from the group consisting of a lanthanide metal, a transition metal and a post-transition metal; N is an alkali or alkaline earth metal; and y is a real number of $0<y\leq 0.50$, x is a real number of $0 \leq x \leq 2.9$ and w is a real number of $0.00001 \leq w \leq 0.5$;

or $$(M_{1-z-r}M^a_zM^b_r)O_{x/2}(OH)_{3-x}:N_w \qquad \text{Formula 3}$$

in the Formula 3, M, $M^a$ and $M^b$ are each one or more metals selected from the group consisting of a lanthanide metal, a transition metal and a post-transition metal; N is an alkali or alkaline earth metal; and each z and r is a real number of $0<z<0.50$ and $0<r<0.50$, x is a real number of $0 \leq x \leq 2.9$, and w is a real number of $0.00001 \leq w \leq 0.5$.

In a certain embodiment, M is yttrium, and M', $M^a$ and $M^b$ are one or more metals selected from the group consisting of Pr, Eu, Gd, Tb, Er, Tm and Yb.

The water-insoluble metal hydroxide (for example, $Y(OH)_3$:Na, $Gd(OH)_3$:Na, $Eu(OH)_3$:Na, $Tm(OH)_3$:Na, $Yb(OH)_3$:Na, $Pr(OH)_3$:Na, $Tb(OH)_3$:Na, and so on) prepared by the method of the present invention may be an excellent fluorescent is material per se, and may be used as a precursor of a fluorescent material which may emit diverse colors depending on a wavelength by means of the doping with an additional metal salt.

In a certain embodiment, the water-insoluble metal hydroxide exhibits fluorescent/light emitting properties by irradiation at a specific wavelength.

Additionally, in the present disclosure, the metal oxide may be feasibly prepared by further performing a heat treatment step, more practically, a heat treatment step at 300° C. or more to less than 1,400° C. The prepared metal oxide may also be applied as a precursor of a fluorescent material which exhibits various light emissions.

In a certain embodiment, the water-insoluble metal hydroxide of the present invention or the metal oxide therefrom exhibits absorption at a wavelength of 490 nm or less. In a certain embodiment, the water-insoluble metal hydroxide of the present invention or the metal oxide therefrom exhibits light emission at a wavelength in a range of 500 to 1,100 nm, more practically, 510 to 1,050 nm, and much more practically, 530 to 1,010 nm.

The light emission property of the present invention may be efficiently applied to a kinescope (film recording of a program) of a illuminating lamp such as LED and a television set as well as a light emitting device such as a laser system. The water-insoluble metal hydroxide of the present invention may be effectively applied as a precursor of a fluorescent material in a light emitting device in that the hydroxide is easily fabricated by a simple process, and has diverse fluorescent/light emitting colors through a combination of various kinds of metals.

In a certain embodiment, the light emitting device of the present invention is a white light emitting diode (LED).

In yet still another aspect of this invention, there is provided a wavelength conversion composition for a solar cell, comprising the aforementioned water-insoluble metal hydroxide or a metal oxide therefrom having an absorption wavelength of 490 nm or less and a light emitting wavelength in a range of 500 to 1,100 nm.

Since the present wavelength conversion composition comprises the above-described water-insoluble metal hydroxide or a metal oxide therefrom as an effective component described above, the common descriptions between them are omitted in order to avoid undue redundancy leading to the complexity of this specification.

In order to be utilized in a solar cell, the wavelength conversion composition needs to have a high conversion efficiency of converting incident solar light energy into electric energy, wherein the conversion efficiency is affected by various factors such as light reflectance of the solar cell, the absorption efficiency at a specific wavelength range, and internal resistance of the cell, and it is known that a silicon solar cell, which has been usually used so far, has a cell efficiency of about 10 to 19%. The solar light includes a light at various wavelength ranges, such as infra-red, visible light, and UV light. As a method for increasing the conversion efficiency, it is expected that the conversion efficiency of the solar cell may be increased where it is possible to convert light at a short wavelength range having a low conversion efficiency (for example, a wavelength range of 500 nm or less) into light at a higher wavelength range. The water-insoluble metal hydroxide or metal oxide which may be used in the composition of the present invention may be effectively applied to a wavelength conversion composition for a solar cell in that light at a low wavelength range may be absorbed, and fluorescence/light emission at a higher wavelength range is exhibited.

In a certain embodiment, the water-insoluble metal hydroxide of this invention or metal oxide therefrom exhibits a light emitting wavelength of from 500 nm or more to less than 1,100 nm (for example, in the case of an yttrium hydroxide doped with terbium and ytterbium, a broad light emission spectrum from 530 nm to 1,010 nm) through an absorption wavelength of 490 nm or less (more practically, 350 to 470 nm) (See: FIG. 11).

The features and advantages of this invention are summarized as follows:

(a) The present invention relates to a novel method for preparing a water-insoluble metal hydroxide, and a use thereof.

(b) The water-insoluble metal hydroxide of the present invention is conveniently and efficiently prepared through the high-temperature heat treatment step two times and the washing step, and thus contains a small amount of an alkali metal and has a high crystallinity and a phase purity.

(c) The water-insoluble metal hydroxide of the present invention or metal oxide therefrom exhibits an absorption wavelength at a low wavelength range (for example, 490 nm or less) and a light emitting wavelength at a high wavelength range (for example, from 500 nm or more to less than 1,100 nm).

(d) Accordingly, the water-insoluble metal hydroxide of the present invention may be efficiently used in various applications such as a fire retardant, an antacid, an adsorbent and so forth, and may also be doped with another metal is ion to be utilized as a raw material for fabricating a catalyst, a fluorescent material, an electrode material, a secondary battery material and the like.

BRIEF DESCRIPTION OF THE DRAWINGS

FIGS. 12a and 12b illustrate an absorption and light emission spectra of the europium-doped yttrium hydroxide, respectively, which is prepared according to Example 29.

DETAILED DESCRIPTION OF THE DISCLOSURE

Hereinafter, the present invention will now be described in further detail by examples. It would be obvious to those skilled in the art that these examples are intended to be more concretely illustrative and the scope of the present invention as set forth in the appended claims is not limited to or by the examples.

EXAMPLE

Reagents and Instruments

Rare earth-based metal nitrates used to prepare a water-insoluble metal is hydroxide are as follows: $Y(NO_3)_3 \cdot 6H_2O$, $Gd(NO_3)_3 \cdot 6H_2O$, $Eu(NO_3)_3 \cdot 6H_2O$, $Er(NO_3)_3 \cdot 5H_2O$, $Tm(NO_3)_3 \cdot xH_2O$, $Yb(NO_3)_3 \cdot 6H_2O$, $Pr(NO_3)_3 \cdot 6H_2O$, and $Tb(NO_3)_3 \cdot 6H_2O$ Products were purchased from Aldrich product (USA). In addition, other $Ca(NO_3)_2$, $Co(NO_3)_3 \cdot 6H_2O$, and $Mg(NO_3)_3 \cdot 6H_2O$ nitrates were obtained from Daejung Chemical & Metals Co., Ltd. $NaNO_2$, $Na_2CO_3 \cdot H_2O$, NaOH, $NaNO_3$, and $LiNO_3 \cdot H_2O$ alkali metal salts and urea were used in products from Daejung Chemical & Metals Co., Ltd.

In order to investigate the phase of the hydrates produced, X-ray diffraction (XRD) patterns obtained by using a Bruker D8 Advance device were analyzed. For component analysis, X-ray fluorescence spectrometry was performed using a Shimadzu device, and a Perkin Elmer LS-40 device was used for measurement of photoluminescence spectrum. In order to obtain a scanning electron microscope (SEM) image, a SEM device manufactured by FEI Co. was used at 15 kV electron beam.

Examples 1 to 26

Preparation of Metal Hydroxides Containing Alkali Metal

Figure 1:
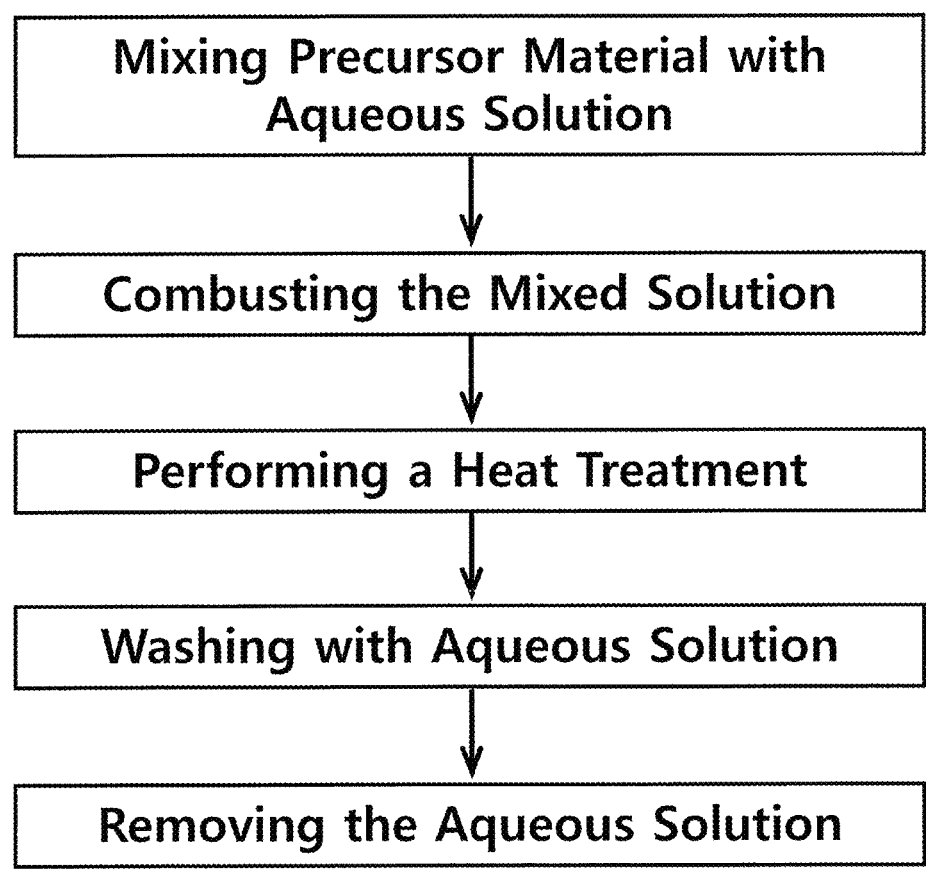
FIG. 1 is a schematic view illustrating the preparation method of a water-insoluble hydroxide according to the present invention.
Figure 2:
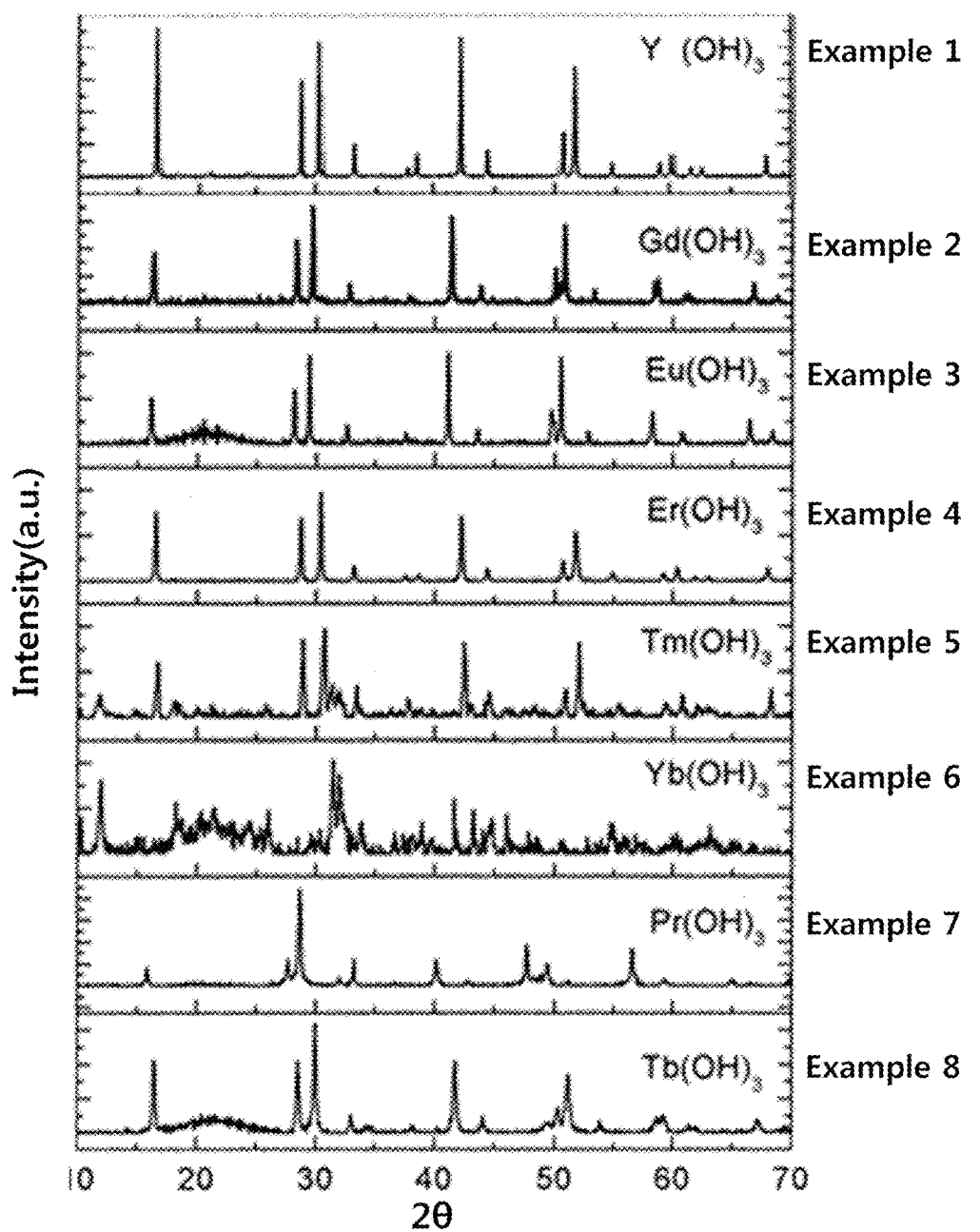
FIG. 2 represents XRD patterns of the water-insoluble hydroxides produced according to Examples 1 to 8 of the present invention.
Figure 3:
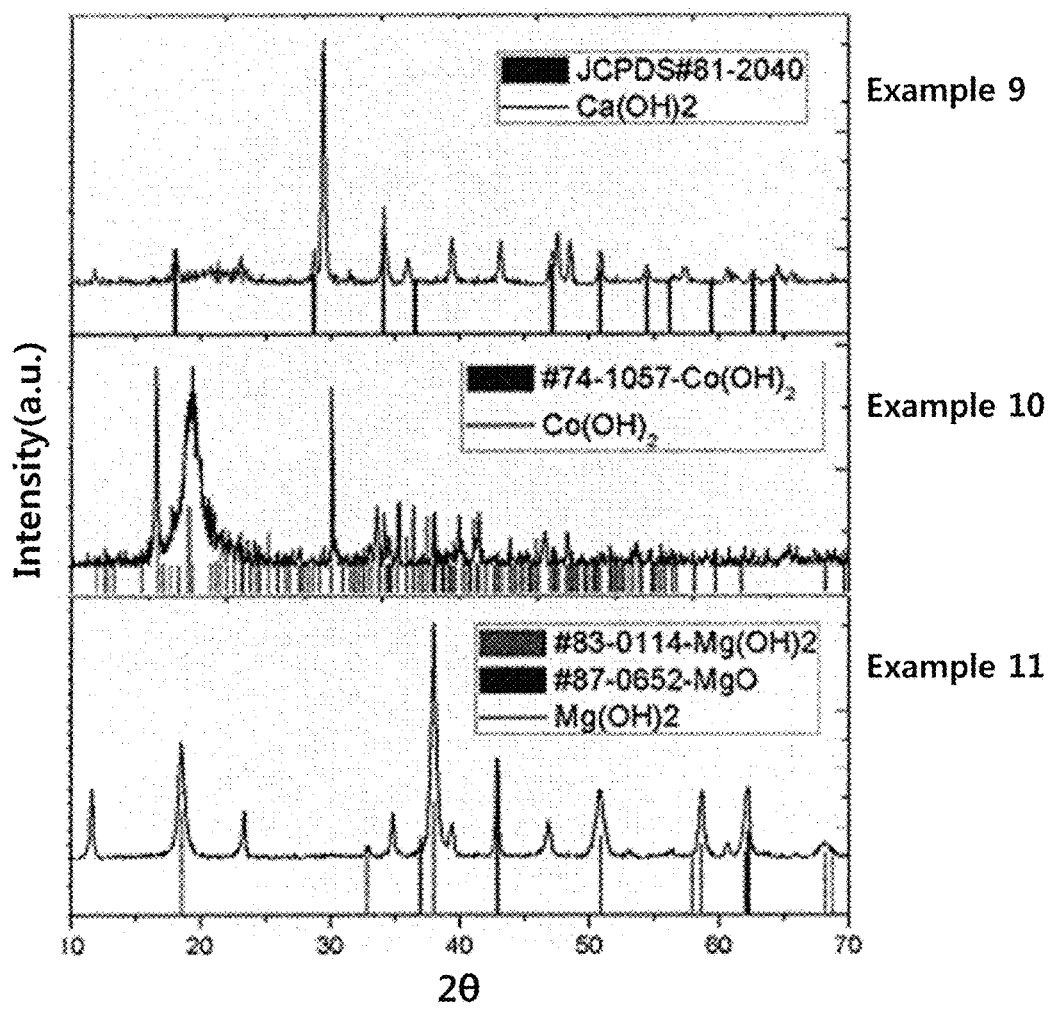
FIG. 3 shows XRD patterns of the water-insoluble hydroxides produced according to Examples 9 to 11 of the present invention.
Figure 4:
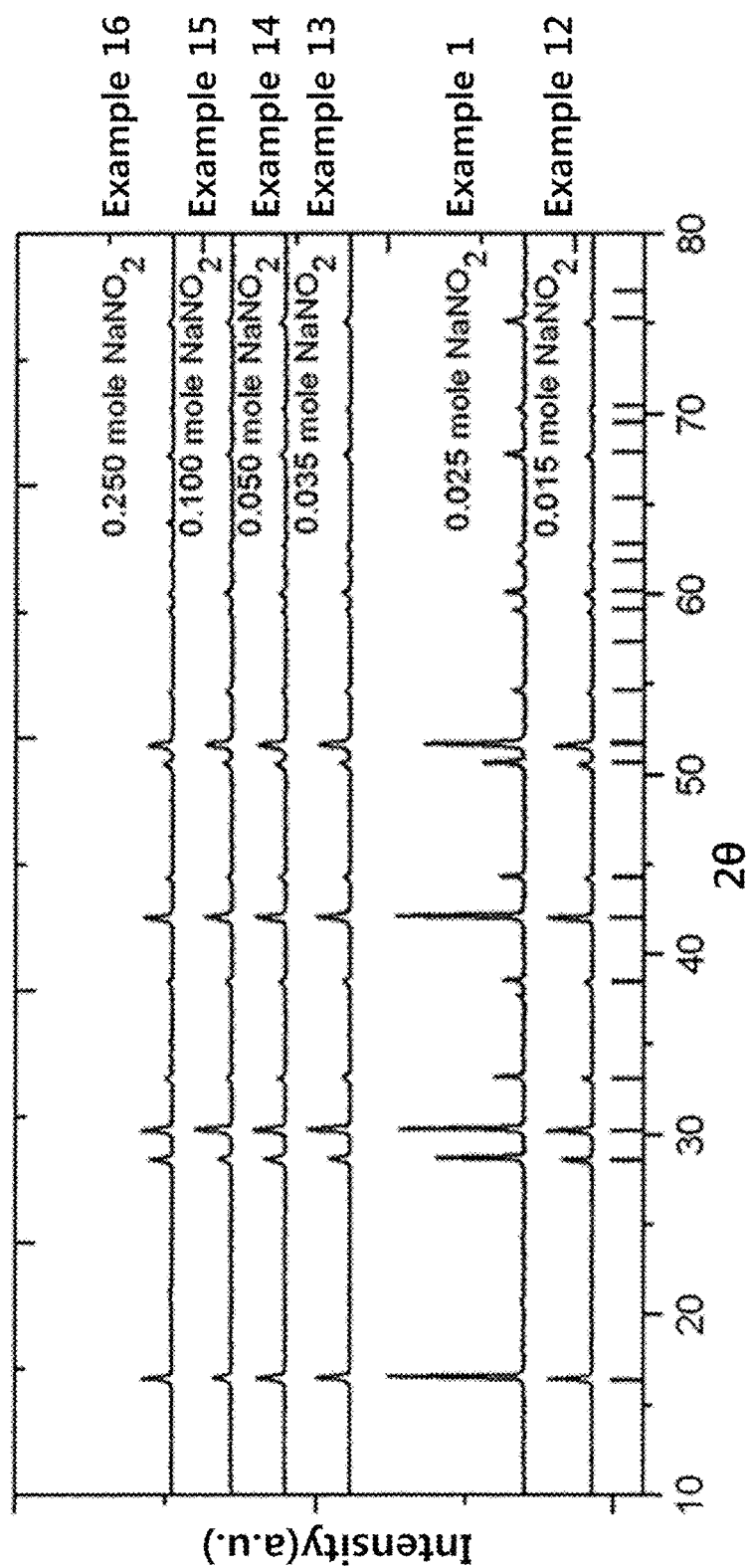
FIG. 4 illustrates XRD patterns of the yttrium hydroxides produced depending on alkali salts at different concentrations according to Examples 1 and 12 to 16 of the present invention.
Figure 5:
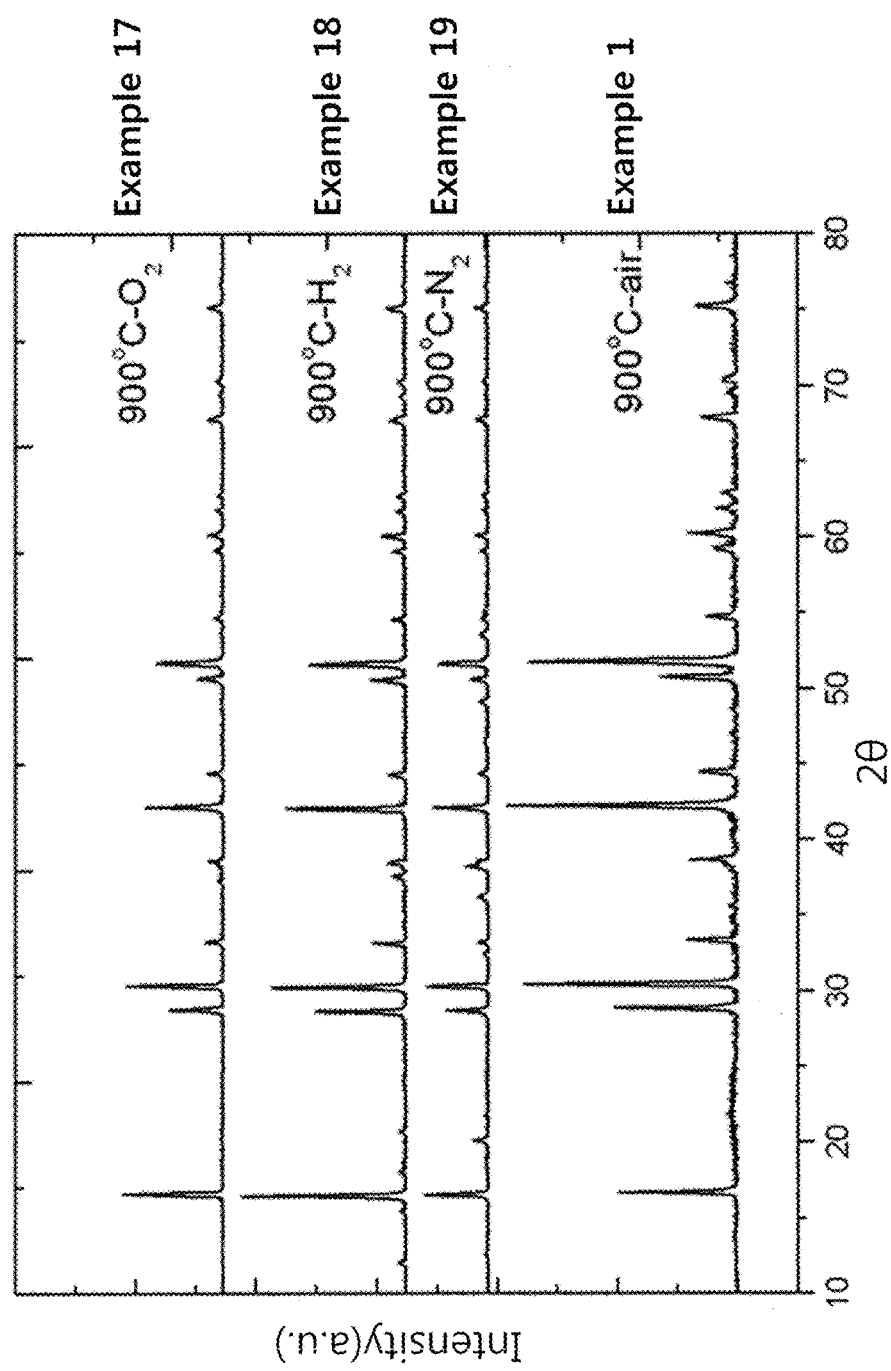
FIG. 5 is XRD patterns of the yttrium hydroxides produced by heat treatment at different atmospheres (99% or more of oxygen, hydrogen, and nitrogen) according to Examples 17 to 19 of this invention.
Figure 6:
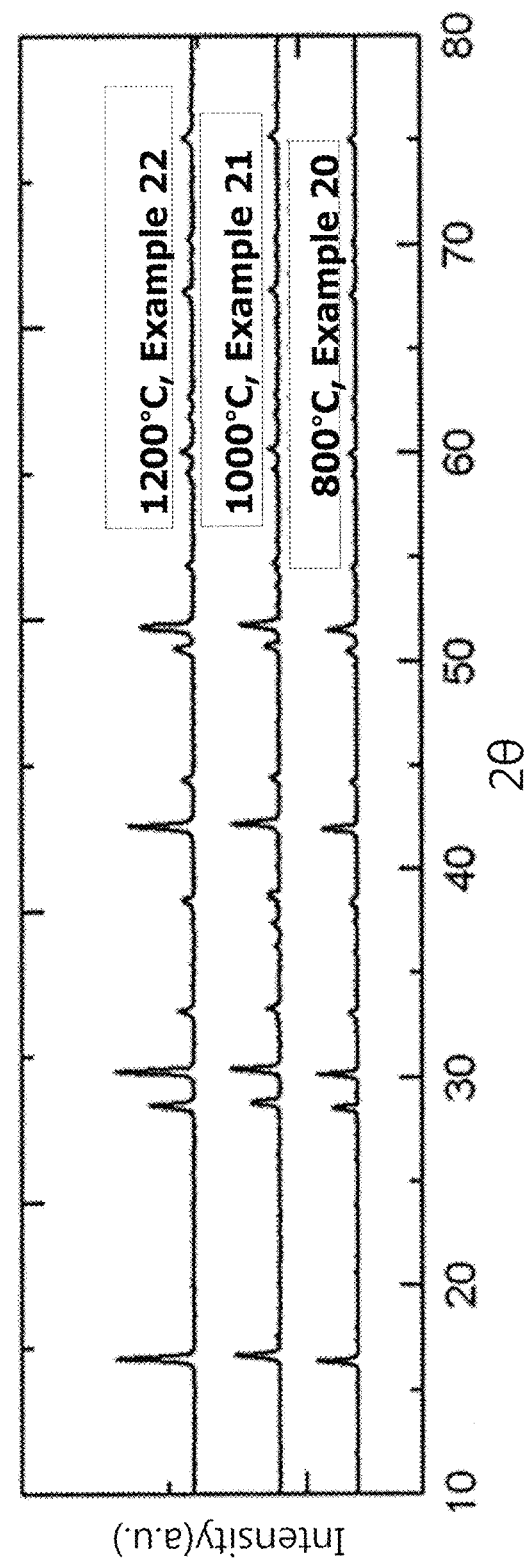
FIG. 6 represents XRD patterns of the yttrium oxides produced by performing heat treatment at different temperatures according to Examples 20 to 22 of the present invention.
Figure 7:
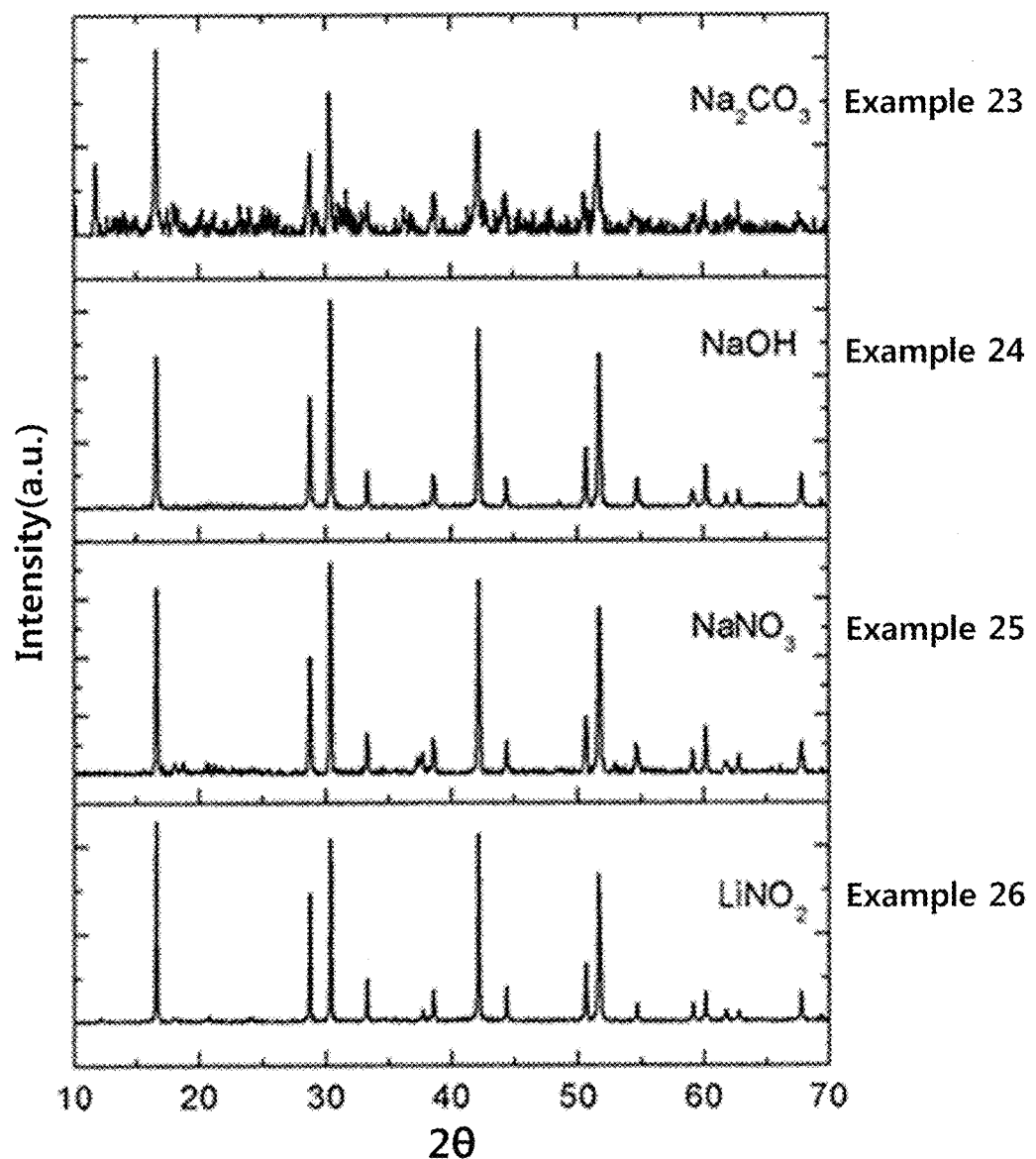
FIG. 7 shows a XRD patterns of the yttrium hydroxides prepared into alkali salts according to Examples 23 to 26 of the present invention.
Figure 8:
FIG. 8 illustrates a SEM image of the yttrium hydrate fabricated according to Example 1 of this invention.

A metal salt (0.01 mol), an alkali salt (0.015-0.25 mol) and an urea (0.02 mol) were put into a 200 ml-alumina crucible, and 50 ml of water was added thereto, followed by stirring the mixture until it became a transparent solution, and then the resulting product was transferred to an electric furnace pre-heated to 500° C. First, while the urea was combusted at about 5 min after water was evaporated, flame was produced and lasted for several seconds to several minutes to be extinguished. The combustion product was a white powder, and was again subjected to heat treatment at 800° C. or more in an electric furnace for 2 hrs. The heat-treated powder was cooled down to room temperature, and then washed five times with 10 ml of water. The remaining water-insoluble solid was separated with a centrifuge, and then dried at room temperature to obtain a water-insoluble metal hydroxide as a solid. The precursors used to prepare metal hydroxides in the present invention and the resulting products thereof are shown in the following Table 1, respectively. The XRD patterns of the metal hydrate prepared in each Example are illustrated in FIGS. 2 to 7. FIG. 8 is a SEM image of the yttrium hydroxide produced according to Example 1. The XRF component analysis results of the metal hydrate prepared in Example 1 are shown in Table 2. In the results of Table 2, it was confirmed that a large amount of alkali components were remaining when the washing step was performed after the heat treatment at 900° C.

TABLE 1

| | Metal hydroxide | Metal salt precursor | Alkali salt precursor | Heat treatment condition |
|---|---|---|---|---|
| Example 1 | $Y(OH)_3$:Na | $Y(NO_3)_3 \cdot 6H_2O$ 0.01 mol | $NaNO_2$ 0.025 mol | atmosphere at 900° C. |
| Example 2 | $Gd(OH)_3$:Na | $Gd(NO_3)_3 \cdot 6H_2O$ | The same as described above | The same as described above |
| Example 3 | $Eu(OH)_3$:Na | $Eu(NO_3)_3 \cdot 6H_2O$ | The same as described above | The same as described above |
| Example 4 | $Er(OH)_3$:Na | $Er(NO_3)_3 \cdot 5H_2O$ | The same as described above | The same as described above |
| Example 5 | $Tm(OH)_3$:Na | $Tm(NO_3)_3 \cdot xH_2O$ | The same as described above | The same as described above |
| Example 6 | $Yb(OH)_3$:Na | $Yb(NO_3)_3 \cdot 6H_2O$ | The same as described above | The same as described above |
| Example 7 | $Pr(OH)_3$:Na | $Pr(NO_3)_3 \cdot 6H_2O$ | The same as described above | The same as described above |
| Example 8 | $Tb(OH)_3$:Na | $Tb(NO_3)_3 \cdot 6H_2O$ | The same as described above | The same as described above |
| Example 9 | $Ca(OH)_3$:Na | $Ca(NO_3)_2$ | The same as described above | The same as described above |
| Example 10 | $Co(OH)_3$:Na | $Co(NO_3)_3 \cdot 6H_2O$ | The same as described above | The same as described above |
| Example 11 | $Mg(OH)_3$:Na | $Mg(NO_3)_3 \cdot 6H_2O$ | The same as described above | The same as described above |
| Example 12 | $Y(OH)_3$:Na | $Y(NO_3)_3 \cdot 6H_2O$ | $NaNO_2$ 0.015 mol | The same as described above |
| Example 13 | $Y(OH)_3$:Na | $Y(NO_3)_3 \cdot 6H_2O$ | $NaNO_2$ 0.035 mol | The same as described above |
| Example 14 | $Y(OH)_3$:Na | $Y(NO_3)_3 \cdot 6H_2O$ | $NaNO_2$ 0.050 mol | The same as described above |
| Example 15 | $Y(OH)_3$:Na | $Y(NO_3)_3 \cdot 6H_2O$ | $NaNO_2$ 0.100 mol | The same as described above |
| Example 16 | $Y(OH)_3$:Na | $Y(NO_3)_3 \cdot 6H_2O$ | $NaNO_2$ 0.250 mol | The same as described above |
| Example 17 | $Y(OH)_3$:Na | $Y(NO_3)_3 \cdot 6H_2O$ | $NaNO_2$ 0.025 mol | oxygen 99% at 900° C. |
| Example 18 | $Y(OH)_3$:Na | $Y(NO_3)_3 \cdot 6H_2O$ | $NaNO_2$ 0.025 mol | hydrogen 99% at 900° C. |
| Example 19 | $Y(OH)_3$:Na | $Y(NO_3)_3 \cdot 6H_2O$ | $NaNO_2$ 0.025 mol | nitrogen 99% at 900° C. |
| Example 20 | $Y(OH)_3$:Na | $Y(NO_3)_3 \cdot 6H_2O$ | $NaNO_2$ 0.035 mol | atmosphere at 800° C. |
| Example 21 | $Y(OH)_3$:Na | $Y(NO_3)_3 \cdot 6H_2O$ | $NaNO_2$ 0.035 mol | atmosphere at 1,000° C. |

TABLE 1-continued

| | Metal hydroxide | Metal salt precursor | Alkali salt precursor | Heat treatment condition |
|---|---|---|---|---|
| Example 22 | $Y(OH)_3$:Na | $Y(NO_3)_3 \cdot 6H_2O$ | $NaNO_2$ 0.035 mol | atmosphere at 1,200° C. |
| Example 23 | $Y(OH)_3$:Na | $Y(NO_3)_3 \cdot 6H_2O$ | $Na_2CO_3 \cdot H_2O$ 0.025 mol | atmosphere at 900° C. |
| Example 24 | $Y(OH)_3$:Na | $Y(NO_3)_3 \cdot 6H_2O$ | NaOH 0.025 mol | atmosphere at 900° C. |
| Example 25 | $Y(OH)_3$:Na | $Y(NO_3)_3 \cdot 6H_2O$ | $NaNO_3$ 0.025 mol | atmosphere at 900° C. |
| Example 26 | $Y(OH)_3$:Li | $Y(NO_3)_3 \cdot 6H_2O$ | $LiNO_3 \cdot H_2O$ 0.025 mol | atmosphere at 900° C. |
| Example 27 | $Y_{0.95}Tb_{0.05}(OH)_3$:Na | $Y(NO_3)_3 \cdot 6H_2O$ $Tb(NO_3)_3 \cdot 6H_2O$ | $NaNO_2$ 0.025 mol | The same as described above |
| Example 28 | $Y_{0.85}Tb_{0.05}Yb_{0.15}(OH)_3$:Na | $Y(NO_3)_3 \cdot 6H_2O$ $Tb(NO_3)_3 \cdot 6H_2O$ $Yb(NO_3)_3 \cdot 6H_2O$ | The same as described above | The same as described above |
| Example 29 | $Y_{0.95}Eu_{0.05}(OH)_3$:Na | $Y(NO_3)_3 \cdot 6H_2O$ $Eu(NO_3)_3 \cdot 6H_2O$ | The same as described above | The same as described above |

TABLE 2

Comparison of XRF Component Analysis of Combustion Product and Final Product in Example 1 of the Present Invention

| Sample | Na atm % | Y atm % |
|---|---|---|
| Combustion product (after combustion oxidation) | 35 | 65 |
| Before washing after heat treatment at 900° C. | 41 | 59 |
| After washing after heat treatment at 900° C. | 30 | 70 |
| Comparative Example 1 (After washing without heat treatment) | 1 | 99 |

Example 27

Preparation of Hydroxide Doped with Two Water-Insoluble Metals

Figure 9:
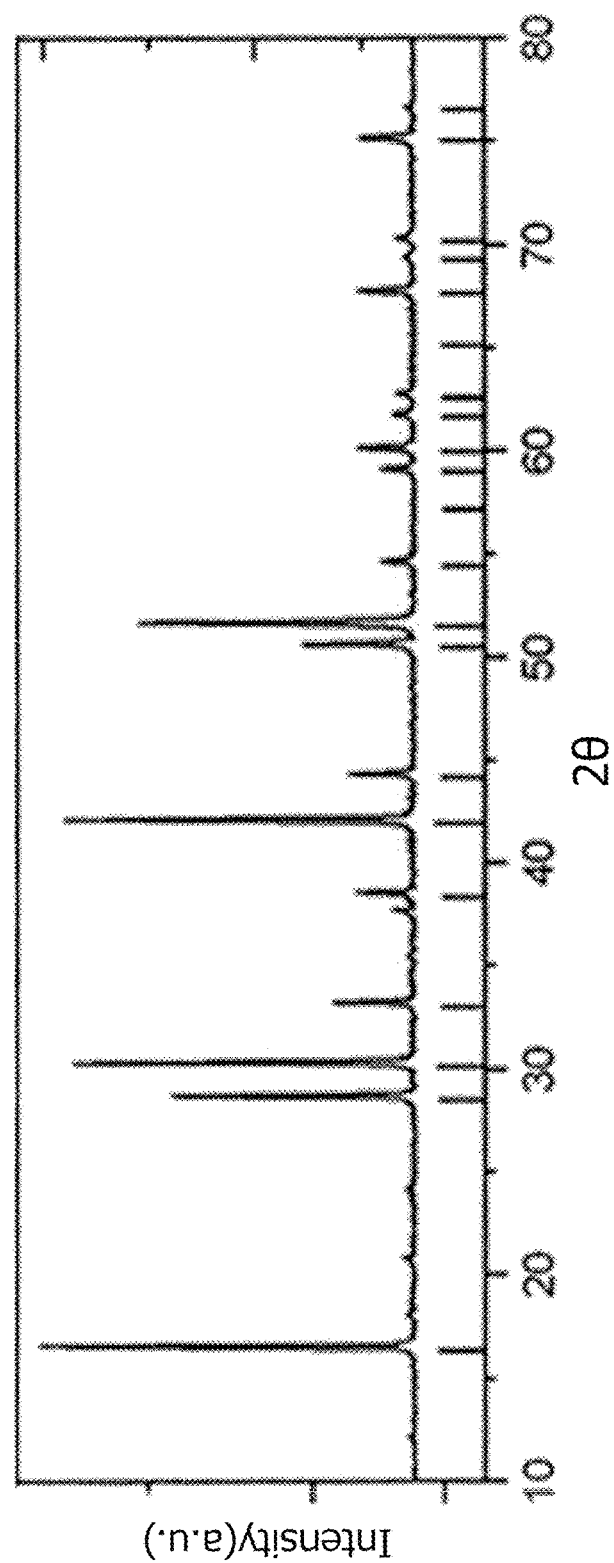
FIG. 9 is a XRD patterns of the terbium-doped yttrium hydroxide which is prepared according to Example 27 of the present invention.
Figure 10:
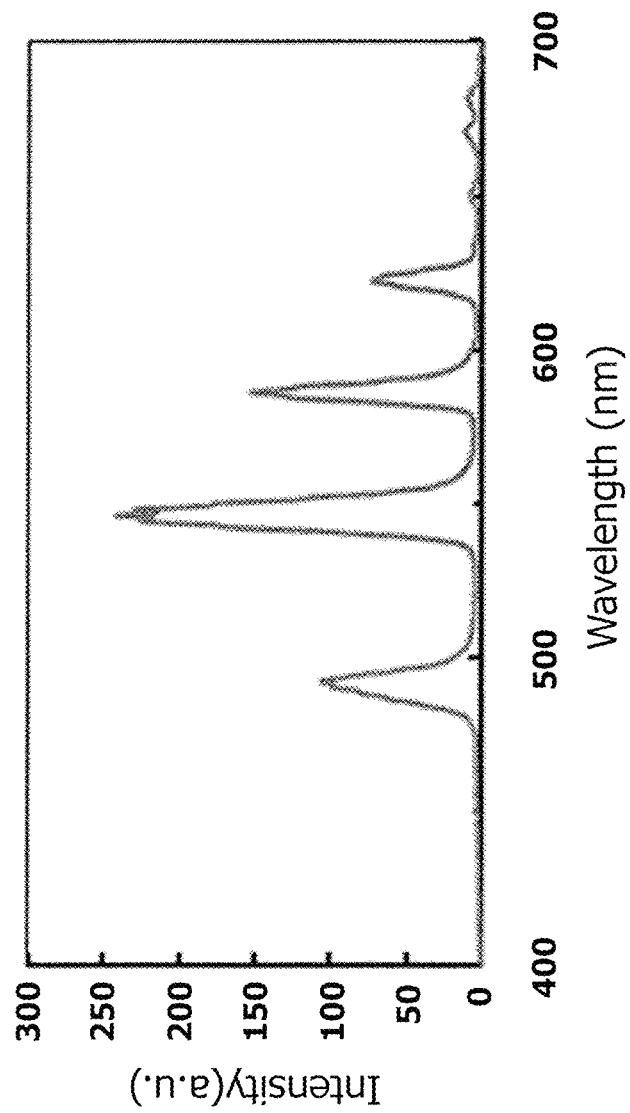
FIG. 10 represents a light emission spectrum of the terbium-doped yttrium hydroxide which is prepared according to Example 27.

Yttrium nitrate ($Y(NO_3)_3 \cdot 6H_2O$, 0.0095 mol), terbium nitrate ($Tb(NO_3)_3 \cdot 6H_2O$, 0.0005 mol) were mixed with sodium nitrite ($NaNO_2$, 0.015-0.25 mol) and urea (0.02 mol), and the mixture was put into a 200 ml-alumina crucible, and 50 ml of water was added thereto, followed by stirring the mixture until it became a transparent solution, and then the resulting product was transferred to an electric furnace pre-heated to 500° C. After water was evaporated, the combustion (oxidation) reaction started, lasted for several minutes, and then stopped. The combustion product was a white powder, and was again subjected to heat treatment at 900° C. in an electric furnace for 2 hrs. The heat-treated powder was cooled down to room temperature, and then washed five times with 10 ml of water. The remaining solid was separated by a centrifuge, and then dried at room temperature to obtain a terbium-doped yttrium hydrate as a solid. The produced hydrate exhibits a bright green light emission when an UV light source is radiated at 365 nm. The XRD pattern and photo light emission spectrum of the corresponding hydroxide were illustrated in FIGS. 9 and 10, respectively.

Example 28

Preparation of Hydroxide Doped with Three Water-Insoluble Metals

Figure 11:
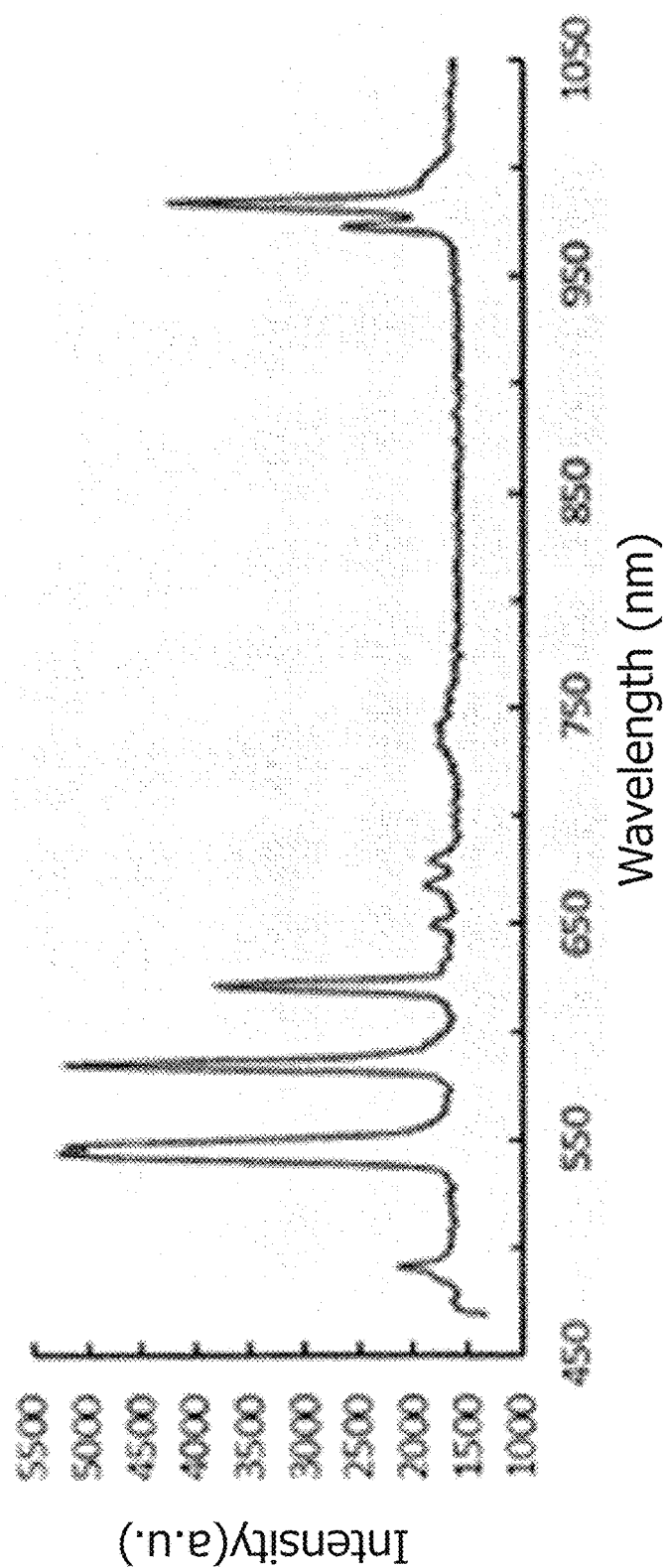
FIG. 11 is a light emission spectrum of both terbium and ytterbium-doped yttrium hydroxide, which is prepared according to Example 28.

Yttrium nitrate ($Y(NO_3)_3 \cdot 6H_2O$, 0.0085 mol), terbium nitrate ($Tb(NO_3)_3 \cdot 6H_2O$, 0.0005 mol), and ytterbium nitrate ($Yb(NO_3)_3 \cdot 6H_2O$, 0.0015 mol) were mixed with sodium nitrite ($NaNO_2$, 0.015-0.25 mol) and urea (0.02 mol), and the mixture was put into a 200 ml-alumina crucible, 50 ml of water was added thereto, the mixture was stirred until the mixture became a transparent solution, and then the resulting product was transferred to an electric furnace pre-heated to 500° C. The remaining process was performed in the same manner as in Example 27. The XRD pattern of the corresponding hydrate was obtained is similarly to the results of Example 27 (result not shown), and the light emission spectrum was shown in FIG. 11.

Example 29

Preparation of Hydroxide Doped with Two Water-Insoluble Metals

As in Example 27, two nitrates were used, but europium nitrate ($Eu(NO_3)_3 \cdot 6H_2O$, 0.0005 mol) instead of terbium nitrate ($Tb(NO_3)_3 \cdot 6H_2O$, 0.0005 mol) was used to perform the process in the same manner as in Example 27. The XRD pattern of the corresponding hydroxide was shown as in FIG. 9, and the light emission spectrum was obtained by shifting the absorption wavelength and the light emission wavelength into 460 nm and 613 nm, respectively (FIGS. 12a and 12b). This fluorescent material may be utilized as a fluorescent material with a wavelength conversion for a blue magneto-luminescent device in the blue region.

Example 30

Preparation of Yttrium Oxide from Yttrium Hydroxide

Figure 13:
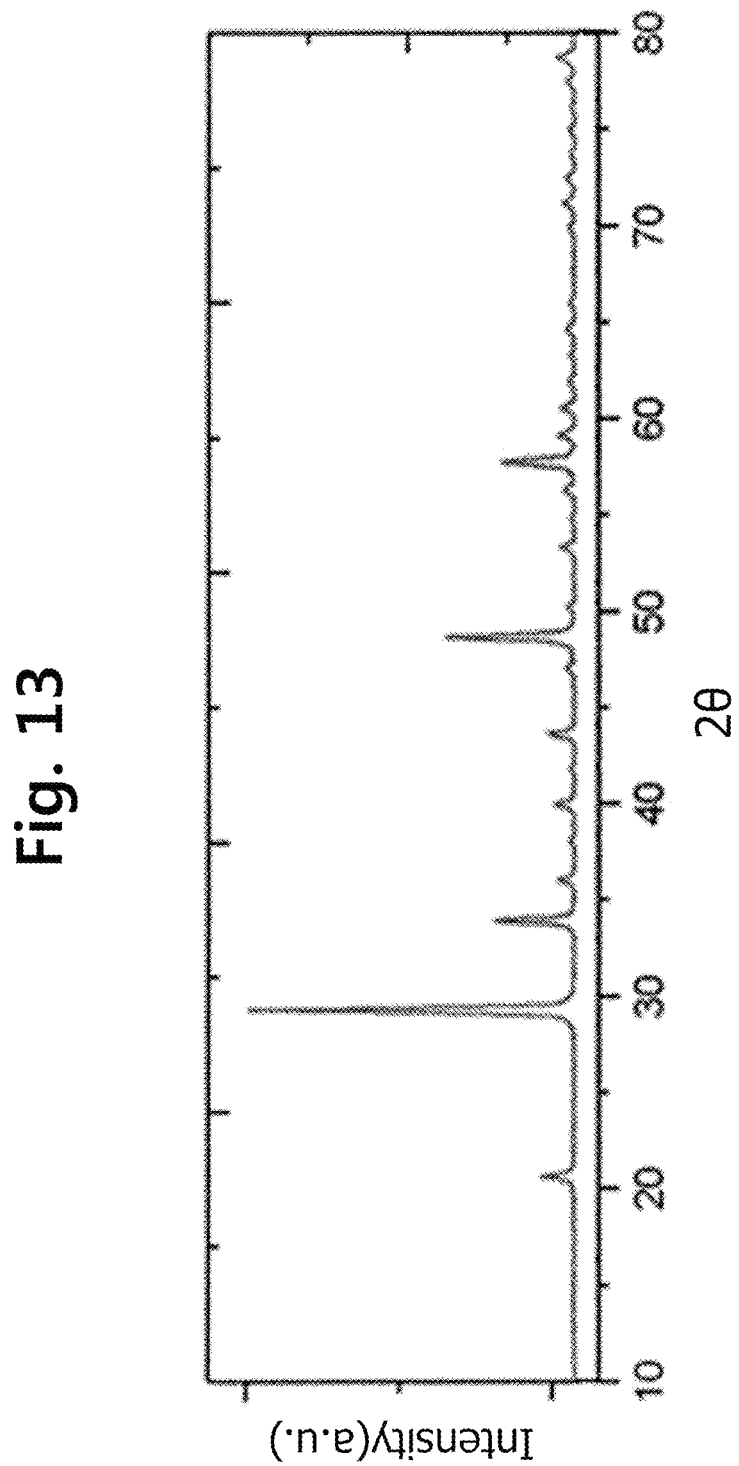
FIG. 13 represents an XRD pattern of the yttrium oxide prepared according to Example 28 of the present invention.
Figure 14:
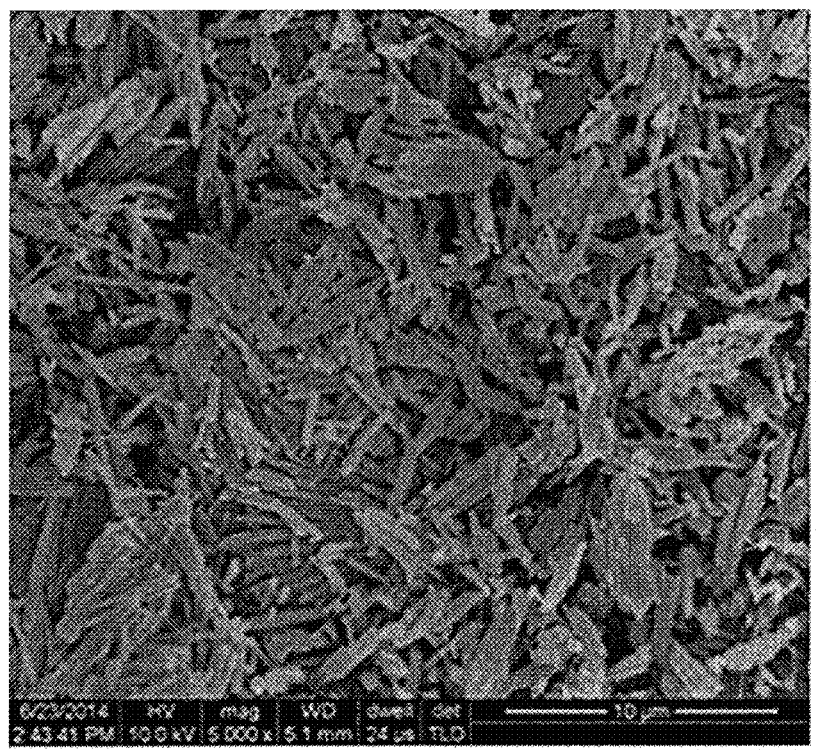
FIG. 14 illustrates a SEM image of the yttrium oxide prepared according to Example 28 of this invention.

The resulting product in Example 1 may be converted into yttrium oxide by heating. Two g of the yttrium hydroxide powder produced in Example 1 was put into a 10 ml-alumina crucible, and subjected to heat treatment at 400° C. in an electric furnace for 2 hrs. At this time, the heat treatment temperature may be controlled from 300° C. or more to less than 1,300° C. After the heat treatment, the to crucible was cooled down to room temperature to obtain yttrium oxide as a white solid. During the heat treatment, the weight was reduced by about 20%. The XRD pattern and SEM image of the yttrium oxide produced are represented in FIGS. 13 and 14, respectively.

Comparative Example 1

When Washing is Performed without Heat Treatment in Example 1

Figure 15:
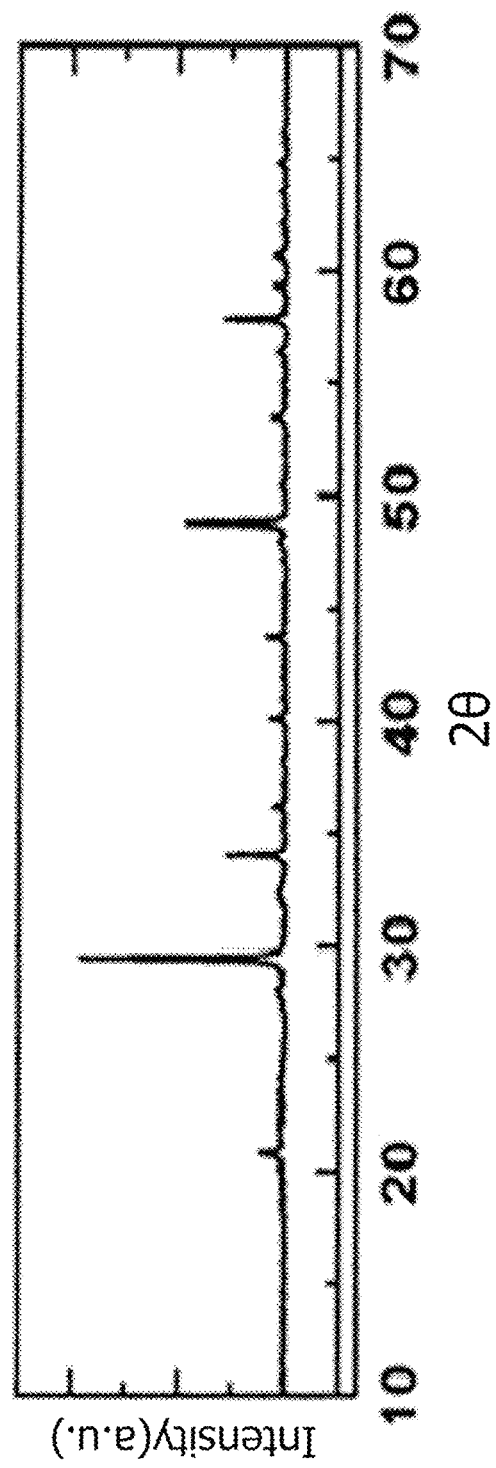
FIG. 15 is a XRD pattern of the powder prepared according to Comparative Example 1 of the present invention.

The combustion process was performed in the same manner as in Example 1. However, the washing step was immediately performed without heat treatment after the combustion as follows. The white solid obtained after the combustion was washed five times with 10 ml of water, and then dried at room temperature. At this time, it was confirmed through XRD patterns that the powder obtained was a composite oxide, not a metal hydroxide. And then, it was demonstrated through the XRF result that sodium ions had been significantly reduced. The corresponding XRD and XRF results are illustrated in FIG. 15 and Table 2, respectively.

Comparative Example 2

When Preparation is Performed without Alkali Salt in Example 1

Figure 16:
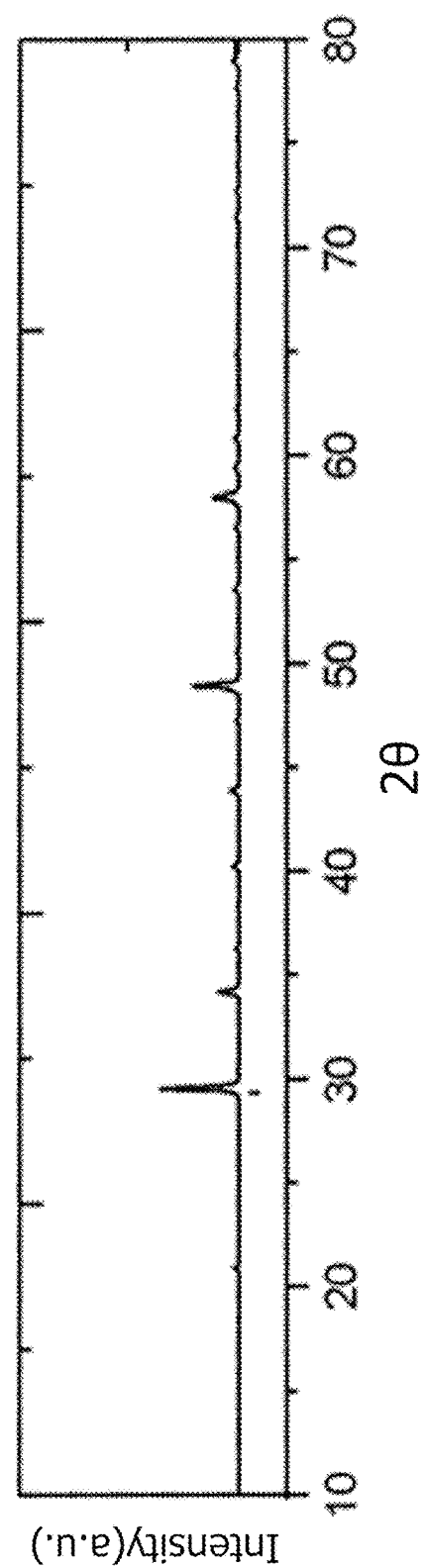
FIG. 16 shows a XRD pattern of the yttrium oxide prepared according to Comparative Example 2 of this invention.

Only yttrium nitrate $(Y(NO_3)_3 \cdot 6H_2O$, 0.0095 mol) and urea (0.02 mol) were put into a 200 ml-alumina crucible, 50 ml of water added thereto, the mixture was stirred until the mixture became a transparent solution, and then the resulting product was transferred to an electric furnace pre-heated to 500° C. After water was evaporated, the combustion (oxidation) reaction started, lasted for several minutes, and then stopped. The combustion product was a white powder, and to was again subjected to heat treatment at 900° C. in an electric furnace for 2 hrs. The heat-treated powder was cooled down to room temperature, and then washed five times with 10 ml of water. The remaining solid was separated by a centrifuge, and then dried at room temperature to obtain a white solid. It was confirmed through the XRD pattern that the resulting product was yttrium oxide, not a hydrate (FIG. 16).

When a yttrium hydrate-based compound according to the present invention is prepared, lanthanide or transition metal ions may be added together, and in this case, much stronger light emission may be obtained from the lanthanide or transition metal ions because a yttrium hydrate-based compound to be the resulting product acts as a host. Accordingly, a yttrium oxide (Example 30), which may be used as a host of a fluorescent material and formed by conversion of the oxide, has a high crystallinity, and thus may exhibit good functionality when used as a fluorescent material, a catalyst, a ceramic material and the like.

Although the specific part of the present disclosure has been described in detail, it will be obvious to those skilled in the art that such a specific description is just one exemplary embodiment and the scope of the present disclosure is not limited thereby. Therefore, the substantial scope of the present disclosure will be defined by the appended claims and equivalents thereof.

What is claimed is:

1. A method for preparing a water-insoluble metal hydroxide, comprising the steps of:
   (a) combusting a mixed aqueous solution of a metal salt, an alkali salt and an urea at a temperature of from more than 400° C. to less than 700° C.;
   (b) subjecting a powder obtained in step (a) to heat treatment at a temperature of 700° C. to 1,300° C.; and
   (c) washing a powder obtained in step (b) with an aqueous solution,
   wherein the metal salt is one or more metal salts selected from the group consisting of a lanthanide metal, a transition metal and a post-transition metal, and
   the water-insoluble metal hydroxide is represented by the following Formula 2:

$$(M_{1-y}M'_y)O_{x/2}(OH)_{3-x}:N_w \qquad \text{Formula 2}$$
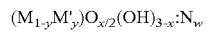

in the Formula 2, M and M' are each one or more metals selected from the group consisting of a lanthanide metal, a transition metal and a post-transition metal; N is an alkali or alkaline earth metal; and y is a real number of $0<y \leq 0.50$, x is a real number of $0 \leq x \leq 2.9$ and w is a real number of $0.001 \leq w \leq 0.5$.

2. The method of claim 1, wherein the lanthanide metal is La, Ce, Pr, Nd, Pm, Sm, Eu, Gd, Tb, Dy, Ho, Er, Tm, Yb or Lu.

3. The method of claim 1, wherein the transition metal is Mn, Fe, Co, Ni, Cu, Zn, Y, Zr, Mo, Ru, Rh, Ag, Cd, Ir, W, Au or Hg.

4. The method of claim 1, wherein the post-transition metal is Al, Ga, In, Sn, Tl, Pb or Bi.

5. The method of claim 1, wherein the alkali salt is an alkali metal or alkaline earth metal salt.

6. The method of claim 5, wherein the alkali metal or alkaline earth metal salt is a salt compound comprising Li, Na, K, RID, Cs, Fr, Be, Mg, Ca, Sr, Ba or Ra.

7. The method of claim 1, wherein the alkali salt comprises an amount of at least one equivalent or larger than an amount of the metal salt.

8. The method of claim 1, wherein an amount of the alkali salt remaining in the metal hydroxide is in a range of 0.001 to 50 atm % compared with that of the metal salt.

9. The method of claim 1, wherein a heat treatment time in step (b) is carried out for 1 to 4 hours.

10. The method of claim 1, wherein the method further comprises a step of removing the aqueous solution.

11. The method of claim 1, wherein the water-insoluble metal hydroxide exhibits a fluorescent or light emitting property.

12. The method of claim 1, wherein the water-insoluble metal hydroxide exhibits an absorption wavelength of 490 nm or less and a light emitting wavelength in a range of 500 nm to 1,100 nm.

13. The method of claim 1, wherein the water-insoluble metal hydroxide is represented by the following Formula 3 when the water-insoluble metal hydroxide comprises three or more metals:

$$(M_{1-z-r}M^a_z M^b_r)O_{x/2}(OH)_{3-x}:N_w \qquad \text{Formula 3}$$
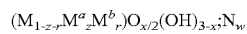

in the Formula 3, M, $M^a$ and $M^b$ are each one or more metals selected from the group consisting of a lanthanide metal, a transition metal and a post-transition metal; N is an alkali or alkaline earth metal; and each z and r is a real number of $0<z<0.50$ and $0<r<0.50$, x is a real number of $0 \leq x \leq 2.9$, and w is a real n mber of $0.001 \leq w 0.5$.

14. The method of claim 1, wherein the method further comprises a step of heating the water-insoluble metal hydroxide in a temperature range of 300'C to 1,400° C. to obtain a water-insoluble metal oxide.

15. A light emitting device comprising the fluorescent water-insoluble metal hydroxide prepared according to the method of claim 1, and a excitation light source of 490 nm or less.

16. The light emitting device of claim 14, wherein the light ernitting device is a white light emitting diode (LED).

* * * * *